(12) United States Patent
Lee et al.

(10) Patent No.: US 9,006,744 B2
(45) Date of Patent: Apr. 14, 2015

(54) ARRAY SUBSTRATE OF LIQUID CRYSTAL DISPLAY DEVICE

(71) Applicant: LG Display Co., Ltd., Seoul (KR)

(72) Inventors: Jae Seok Lee, Gumi-si (KR); Jae Chang Kwon, Gumi-si (KR); Yu Ri Shim, Gumi-si (KR); Min Bo Kim, Gyeongsan-si (KR)

(73) Assignee: LG Display Co., Ltd., Seoul (KR)

( * ) Notice: Subject to any disclaimer, the term of this patent is extended or adjusted under 35 U.S.C. 154(b) by 8 days.

(21) Appl. No.: 13/928,281

(22) Filed: Jun. 26, 2013

(65) Prior Publication Data

US 2014/0131713 A1  May 15, 2014

(30) Foreign Application Priority Data

Nov. 12, 2012 (KR) .................. 10-2012-0127196

(51) Int. Cl.
*H01L 29/04* (2006.01)
*H01L 31/036* (2006.01)
*H01L 29/76* (2006.01)
*G02F 1/136* (2006.01)
*H01L 29/786* (2006.01)
*H01L 29/66* (2006.01)
*H01L 27/12* (2006.01)

(52) U.S. Cl.
CPC .... *H01L 29/78669* (2013.01); *H01L 29/66765* (2013.01); *H01L 27/1214* (2013.01); *H01L 29/78633* (2013.01)

(58) Field of Classification Search
CPC ............... H01L 27/1214; H01L 29/78633; H01L 27/1288; H01L 29/42384; H01L 29/4908; H01L 29/78627; H01L 29/78696; H01L 29/66765; H01L 29/78678; H01L 27/3272
USPC .............. 257/59, 72, E29.273, 57, 66, 294; 349/43, 139, 46
See application file for complete search history.

(56) References Cited

U.S. PATENT DOCUMENTS

| | | | | |
|---|---|---|---|---|
| 6,303,946 | B1 * | 10/2001 | Sung ............................... | 257/72 |
| 2001/0030324 | A1 * | 10/2001 | Morikawa et al. .............. | 257/59 |
| 2011/0180798 | A1 * | 7/2011 | Shim et al. ..................... | 257/59 |
| 2014/0008656 | A1 | 1/2014 | Shim et al. | |

* cited by examiner

*Primary Examiner* — Shouxiang Hu
(74) *Attorney, Agent, or Firm* — Fenwick & West LLP

(57) ABSTRACT

An array substrate of a liquid crystal display device and a method of fabricating the array substrate. A gate electrode of a thin film transistor of the array substrate is formed. The gate electrode has an edge region surrounding an interior region of the gate electrode and the edge region of the gate electrode is thicker than the interior region of the gate electrode. A semiconductor layer is formed over the gate electrode. A source electrode and a drain electrode of the thin film transistor are formed that define a channel region in the semiconductor layer. The channel region is located over the interior region of the gate electrode. Additionally, the gate electrode may be formed with a half-tone mask that results in the edge region of the gate electrode being thicker than the interior region of the gate electrode.

10 Claims, 6 Drawing Sheets

ARRAY SUBSTRATE OF LIQUID CRYSTAL DISPLAY DEVICE

CROSS REFERENCE TO RELATED APPLICATIONS

The present application claims priority under 35 U.S.C. §119(a) to Korean Patent Application No. 10-2012-0127196 filed on Nov. 12, 2012, which is hereby incorporated by reference in its entirety.

BACKGROUND

1. Field of the Disclosure

The present application relates to a liquid crystal display device, and more particularly to an array substrate of the liquid crystal display device and a fabricating method thereof which are adapted to provide light blocking films to the upper and lower sides of a thin film transistor, simplify the fabricating process, and reduce fabricating costs.

2. Description of the Related Art

In general, the driving principle of a liquid crystal display device is based on the optical anisotropic property and polarization property of a liquid crystal material. The liquid crystal molecules have a long and thin structure. As such, molecular arrangement of the liquid crystal material has a directional property. Also, the alignment direction of the liquid crystal molecules can be controlled by an electric field artificially applied to a liquid crystal material.

In accordance therewith, when the alignment direction of the liquid crystal molecules is arbitrarily controlled, the molecular arrangement of the liquid crystal material changes. The optical anisotropic property of the liquid crystal material enables light to be refracted along the controlled alignment direction of the liquid crystal molecules. As a result, an image can be displayed.

An active matrix liquid crystal display device (hereinafter, "AM-LCD device") in which a plurality of thin film transistors and a plurality of pixel electrodes each connected to the respective thin film transistors are arranged in a matrix. The AM-LCD device has a high definition and a superior realization of a motion picture. As such, the AM-LCD device is being highlighted in a display industrial field.

The LCD device includes a color filter substrate (i.e., an upper substrate) on which a common electrode is formed, an array substrate (i.e., a lower substrate) on which pixel electrodes are formed, and a liquid crystal material interposed between the upper and lower substrates. Such an LCD device drives the liquid crystal material by applying a vertical electric field between the pixel electrode and the common electrode. As such, the LCD device has superior transmittance, a high aperture ratio and so on. A related art array substrate for an LCD device will now be described referring to FIG. 1.

FIG. 1 is a cross-sectional view showing an array substrate of a first related art LCD device. The array substrate of the first related art LCD device includes a gate line (not shown), a data line (not shown) and a thin film transistor which are formed on a transparent insulation substrate 10. The gate line and the data line cross each other with a gate insulation film 12 therebetween. A pixel region is defined by the gate and data lines crossing each other. The thin film transistor is formed at an intersection of the gate and data lines.

The thin film transistor includes a gate electrode 11 extended from the gate line, the gate insulation film 12 formed on the entire surface of the substrate 10 which includes the gate electrode 11, a semiconductor layer 13 formed on the gate insulation film 12 opposite to the gate electrode 11, and source and drain electrodes 15 and 16 formed in such a manner as to partially overlap with the semiconductor layer 13 and be separated from each other.

Also, the related art array substrate includes a passivation film 17 formed on the entire surface of the substrate 10 which is provided with the source and drain electrodes 15 and 16. The related art array substrate further includes a pixel electrode 14 which is formed on the gate insulation film 12 and electrically connected to the drain electrode 16 of the thin film transistor.

Although it is not shown in the drawing, the first LCD device includes the above-mentioned array substrate (i.e., a thin film transistor substrate) and a color filter substrate configured to face each other. The first LCD device further includes a liquid crystal layer interposed between the color filter substrate and the thin film transistor substrate.

The thin film transistor substrate is defined into a plurality of pixel regions. The thin film transistor, the pixel electrode 14 and a common electrode (not shown) are formed in each pixel region. The pixel electrode 14 and the common electrode are arranged alternately and parallel with each other on the same substrate and separated from each other.

The color filter substrate includes a black matrix which is formed on an opposite region to the gate and data lines formed on the thin film transistor substrate and the thin film transistors formed at the intersections of the gate and data lines. Also, the color filter substrate includes color filters formed opposite the respective pixel regions. In accordance therewith, the liquid crystal layer is driven by a horizontal electric field formed between the common electrode and the pixel electrode 14.

However, the related art LCD device forces the thin film transistor, which includes the source 15 and drain 16 electrodes and the semiconductor layer 13 forming a channel from the source electrode 15 to the drain electrode 16, to be perfectly exposed to external light including sunlight. As such, external light and light being scattered or reflected within the device can irradiate to the channel of the thin film transistor.

In other words, the related art LCD device cannot prevent external light and internally scattered or reflected light which are irradiated from the upside of the thin film transistor into the channel, thereby causing a leakage current in the channel. Due to this resulting leakage current, errors can occur in the image produced by the LCD device. More particularly, the channel portion of the semiconductor layer exposed to light cannot function as a channel because of the resulting leakage current. As such, it is difficult to control a variety of voltages which are necessary to drive the LCD device. Therefore, performance of the LCD device must deteriorate.

To address this matter, an LCD device including light blocking film patterns which are disposed at the up and down sides of the channel of the thin film transistor has been proposed.

FIG. 2 is a cross-sectional view showing an array substrate of a second related art LCD device. Referring to FIG. 2, the array substrate of the second related art LCD device includes: a first insulation film 30 formed on a transparent insulation substrate 20 and configured to have a opening; a first light blocking film pattern 31 formed on the first insulation film 30 provided with the opening; and a first gate insulation 32 formed on the entire surface of the transparent insulation substrate 20 provided with the first light blocking film pattern 31. Also, the array substrate includes: a gate electrode 21 formed on the first gate insulation film 32; a second gate insulation film 22 formed on the first gate insulation film 32 provided with the gate electrode 21; a semiconductor layer 23 formed on the second gate insulation film 22 and overlapped with the first light blocking film pattern 31; a pixel electrode 24 formed on the second gate insulation film 22 in such a manner as to be separated from the semiconductor layer 23; a source electrode 25 formed on the semiconductor layer 23; and a drain electrode 26 directly connected to the pixel electrode 24 and formed in such a manner as to be separated from the source electrode 25. The array substrate further includes: a passivation film 27 formed on the entire surface of the transparent insulation substrate 20 provided with the source and drain electrodes 25 and 26; a second light blocking film pattern 40 formed on the passivation film 27 and overlapped with the first light blocking film pattern 31; a second insulation film 28 formed to cover the passivation film 27 provided with the second light blocking film pattern 40; and a plurality of branched common electrodes 29 formed on the second insulation film 28 and overlapped with the pixel electrode 24.

In this manner, the first and second light blocking film patterns 31 and 40 disposed in the upper and lower sides of the thin film transistor shield light irradiated from a backlight unit onto a channel region of the thin film transistor. As such, the second related art LCD device can prevent the generation of a leakage current in the thin film transistor.

However, in order to form the array substrate of the second related art LCD device, a first masking procedure for forming the first insulation 30 with the opening, a second masking procedure for forming the first light blocking film pattern 31, a third masking procedure for forming the gate electrode 21, a fourth masking procedure for forming the semiconductor layer 23, a fifth masking procedure for the pixel electrode 24 separated from the semiconductor layer 23, a sixth masking procedure for forming the source and drain electrodes 25 and 26 on the semiconductor layer 23 and the pixel electrode 24, a seventh masking procedure for forming the second light blocking film pattern 41, and a eighth masking procedure for forming the common electrode 29 must be performed. Moreover, when a gate pad and a data pad, which are not shown in the drawing, are formed at ends of the gate and data lines, a ninth masking procedure for forming contact holes partially exposing the gate and data lines can be additionally performed.

In this way, a total of nine masking procedures are necessary to fabricate the array substrate of the second related art LCD device. A large number of masking procedures increases fabricating costs, the number of process steps and the probability of generating faults.

SUMMARY

Accordingly, embodiments of the present application are directed to an array substrate of an LCD device that substantially obviates one or more of problems due to the limitations and disadvantages of the related art, and to a method of fabricating the same.

The embodiments are to provide an array substrate of an LCD device which is adapted to block the irradiation of light onto a channel region of a thin film transistor by disposing light blocking members in the up and down sides of the thin film transistor, and a method of fabricating the same.

Also, the embodiments are to provide an array substrate of an LCD device which is adapted to prevent the generation of a leakage current in a thin film transistor by blocking the irradiation of light onto a channel region of the thin film transistor, and a method of fabricating the same.

Furthermore, the embodiments are to provide an array substrate of an LCD device which is adapted to simplify the fabricating process and reduce fabricating costs by allowing a light blocking member opposite to a channel region of a thin film transistor to be used as a gate electrode and using a half-tone mask, and a method of fabricating the same.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In one embodiment, an array substrate of a liquid crystal display device comprises a thin film transistor. The thin film transistor includes a gate electrode having an edge region surrounding an interior region of the gate electrode. The edge region of the gate electrode is thicker than the interior region of the gate electrode. The thin film transistor also includes a source electrode, a drain electrode and a semiconductor layer having a channel region defined by the source electrode and the drain electrode. The channel region is located over the interior region of the gate electrode.

In one embodiment, a light blocking film pattern is formed over the channel region. The gate electrode and the light blocking film pattern can also be comprised of a same material. For example, both the gate electrode and the light blocking film pattern can be comprised of an opaque metal material that blocks light.

The gate electrode may have a wider area than the light blocking film pattern. The gate electrode may have a wider area than a total area occupied by the source electrode, the drain electrode, and the semiconductor layer.

In one embodiment, the drain electrode and source electrode are located over the interior region of the gate electrode.

In one embodiment, a pixel electrode is connected to the source drain electrode and a common electrode overlaps with the pixel electrode.

In one embodiment, a top surface of the edge region of the gate electrode is positioned higher than a top surface of the channel region.

In one embodiment, a method of fabricating an array substrate of a liquid crystal display device is disclosed. The method comprises forming a gate electrode of a thin film transistor. The gate electrode has an edge region surrounding an interior region of the gate electrode and the edge region of the gate electrode is thicker than the interior region of the gate electrode. A semiconductor layer is formed over the gate electrode. A source electrode and a drain electrode of the thin film transistor are formed that define a channel region in the semiconductor layer. The channel region is located over the interior region of the gate electrode. Additionally, the gate electrode may be formed with a half-tone mask that results in the edge region of the gate electrode being thicker than the interior region of the gate electrode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION

Figure 1:
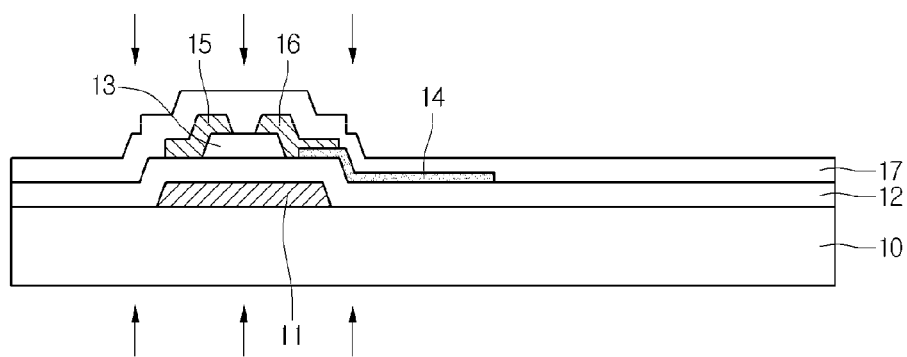
FIG. 1 is a cross-sectional view showing an array substrate of a first LCD device according to the related art.
Figure 2:
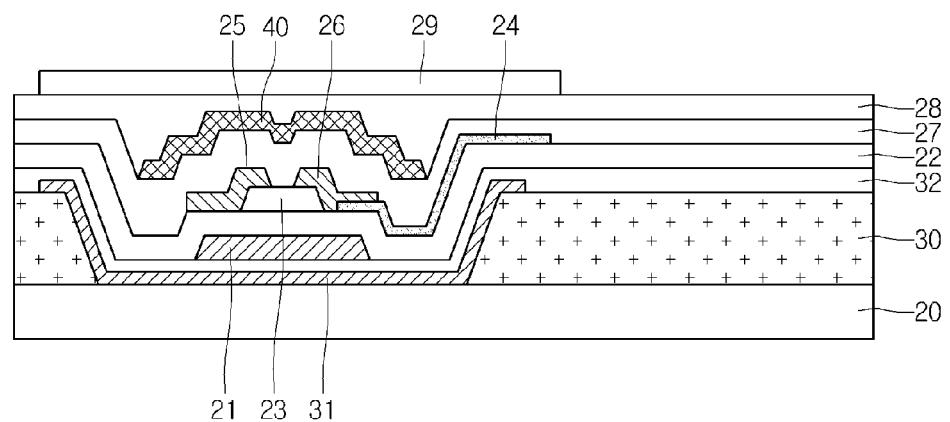
FIG. 2 is a cross-sectional view showing an array substrate of a second LCD device according to the related art.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

In the present disclosure when a structure is described as being on or over another structure, this includes situations where the structures contact each other as well as situations where an intervening structure is disposed therebetween. However, when the term "directly on" or "directly over" is used, it includes only situations where the structures contact each other.

Figure 3:
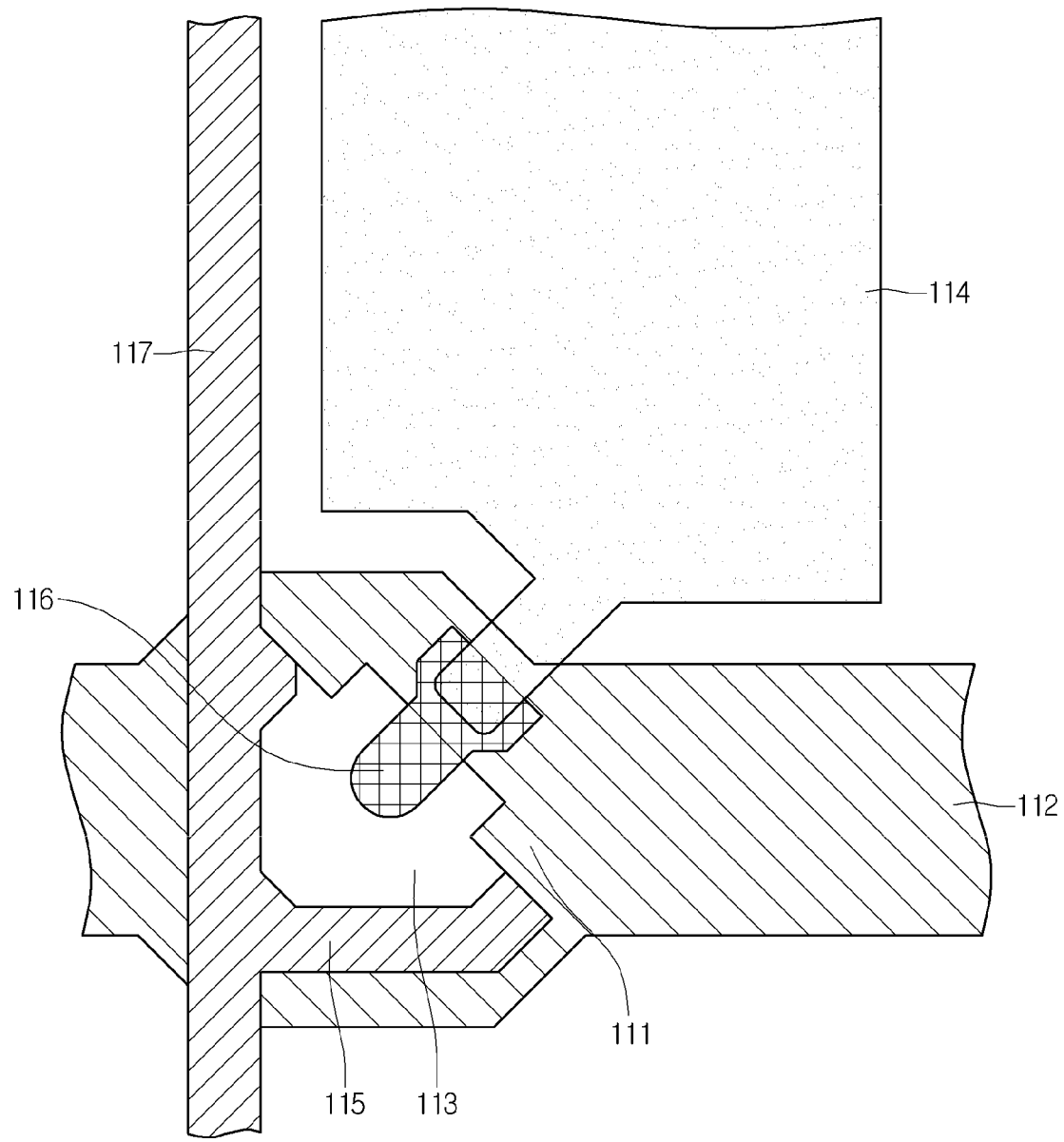
FIG. 3 is a planar view showing an array substrate of an LCD device according to the present disclosure.

FIG. 3 is a planar view showing an array substrate of an LCD device according to the present disclosure.

Referring to FIG. 3, the array substrate of the LCD device according to an embodiment of the present disclosure includes a substrate defined into a display area and a non-display area, a gate line 112 formed in a direction on the substrate, and a data line 117 formed in such a manner as to cross the gate line 112. A pixel region is defined by the gate line 112 and the data line 117 crossing each other. Also, the array substrate includes a thin film transistor formed at an intersection of the gate lines 112 and data lines 117. The thin film transistor includes a gate electrode 111 formed in such a manner as to protrude from the gate line 112, a gate insulation film formed on the gate electrode 111, a semiconductor layer 113 formed on the gate insulation film, a source electrode 115 formed on a part of the semiconductor layer 113 and branched from the data line 117, and a drain electrode 116 formed on another part of the semiconductor layer 113. The array substrate further includes a pixel electrode 114 formed on the gate insulation film in such a manner as to be separated from the semiconductor layer 113. The pixel electrode 114 is in direct contact with the drain electrode 116.

The gate electrode 111 is also used as a first light blocking film pattern. The gate electrode 111 can be formed from an opaque metal material. For example, the gate electrode 111 can be formed from at least one selected from a metal group which includes aluminum Al, tungsten W, copper Cu, molybdenum Mo, chromium Cr, titanium Ti, a molybdenum-tungsten alloy MoW, a molybdenum-titanium alloy MoTi, and a copper/molybdenum-titanium alloy Cu/MoTi. Such a gate electrode 111 used as a first light blocking film pattern shields or reflects incident light from a backlight unit and prevents the generation of a leakage current in the thin film transistor.

The pixel electrode 114 is formed on the entire surface of the pixel region, which is defined by the gate and data lines 112 and 117 crossing each other, in such a manner as to be separated from the gate and data lines 112 and 117. Also, the pixel electrode 114 can be formed from any one selected from a transparent conductive material group which includes indium-tin-oxide ITO and indium-zinc-oxide IZO.

Moreover, the array substrate includes a passivation film (not shown) formed on the entire surface of the substrate on which the source electrode 115 and drain electrode 116 are formed, and a second light blocking film pattern (not shown) formed on the passivation film opposite to the source electrode 115 and drain electrode) 16 and the semiconductor layer 113. The second light blocking film pattern is formed wider than a region in which the source electrode 115 and drain electrode 116 and the semiconductor layer 113 are formed. Also, the second light blocking film pattern overlaps with the gate electrode 111 but is formed narrower than the area of the gate electrode 111. Such a second light blocking film pattern formed in the upper side of the thin film transistor can prevent the inflow of reflected or scattered light into the thin film transistor.

Furthermore, the array substrate includes: an interlayer insulation film (not shown) formed on the entire surface of the substrate provided with the second light blocking film pattern; and a common electrode formed (not shown) on the interlayer insulation film in such a manner as to overlap with the pixel electrode 114. The common electrode can be formed from any one material selected from a transparent conductive material group which includes indium-tin-oxide ITO and indium-zinc-oxide IZO.

Subsequently, a method of fabricating the above-mentioned array substrate of the LCD device will be described in detail referring to FIGS. 4A through 4J.

FIGS. 4A through 4J are cross-sectional views illustrating a method of fabricating an array substrate of an LCD device according to the present disclosure.

Figure 4A:
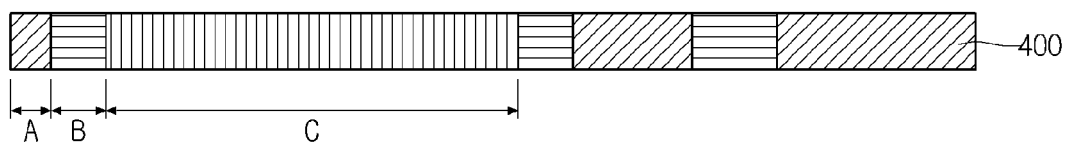
FIGS. 4A through 4J are cross-sectional views illustrating a method of fabricating an array substrate of an LCD device according to the present disclosure.
Figure 4A:
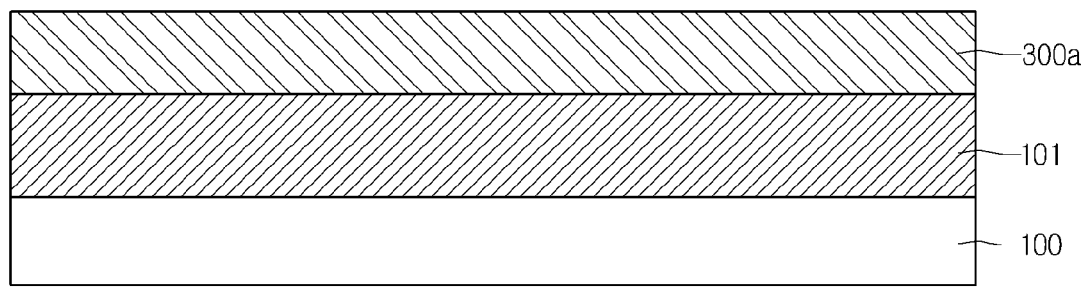

Referring to FIG. 4A, a gate metal layer 101 and a photo resist 300a are stacked on a transparent insulation substrate 100, and a half-tone mask 400 is aligned over the photo resist 300a before irradiating light through the half-tone mask 400. In one embodiment, the half-tone mask 400 can be replaced by a diffraction mask.

The gate metal layer 101 can be formed from an opaque metal material. For example, the gate metal layer 101 can be formed from at least one material selected from a metal group which includes aluminum Al, tungsten W, copper Cu, molybdenum Mo, chromium Cr, titanium Ti, a molybdenum-tungsten alloy MoW, a molybdenum-titanium alloy MoTi, and a copper/molybdenum-titanium alloy Cu/MoTi.

The photo resist 300a can be formed from a photosensitive material, such as a negative photo resist, which is cured by irradiating the photo resist 300a with light. Alternatively, a positive photo resist can be used in the formation of the photo resist 300a instead of the negative photo resist.

Figure 4B:
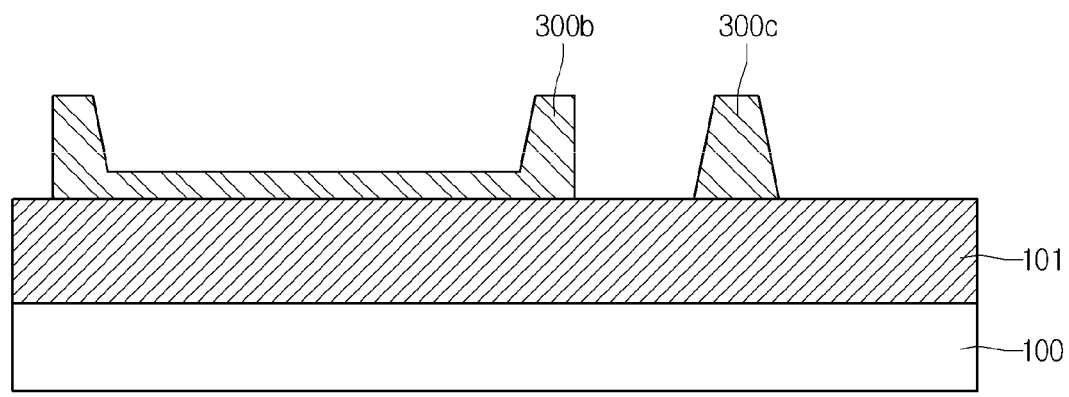

As shown in FIG. 4B, the photo resist 300a is patterned into first and second photo resist patterns 300b and 300c through a photolithography process which uses the half-tone mask 400. The first and second photo resist pattern 300b and 300c are disposed on the gate metal layer 101. The first photo resist pattern 300b is formed to have a stepped portion. In other words, the first photo resist pattern 300b is formed to have a concave structure.

The half-tone mask 400 includes light blocking portions A, transparent portions B and a semi-transparent portion C. The transparent portions B transmit light as it is. The semi-transparent portion C is formed from semi-transparent materials with different transmittances and transmits less light than that of the transparent portion B. The light blocking portions A completely shield light from passing.

As such, the negative photo resist underneath the transparent portions B of the half-tone mask 400 is complete cured by light irradiated through the transparent portions B and forms thick photo resist patterns. The negative photo resist underneath the semi-transparent portion C is semi-cured by a reduced amount of light irradiated through the semi-transparent portion C and forms a thin photo resist pattern. The negative photo resist underneath the blocking portions A of the half-tone mask 400 is completely removed and exposes the gate metal layer 101. In accordance therewith, the first photo resist pattern 300b with the stepped portion and the second photo resist pattern 300c with the same thickness as the thick portion of the first photo resist pattern 300b can be prepared.

Figure 4C:
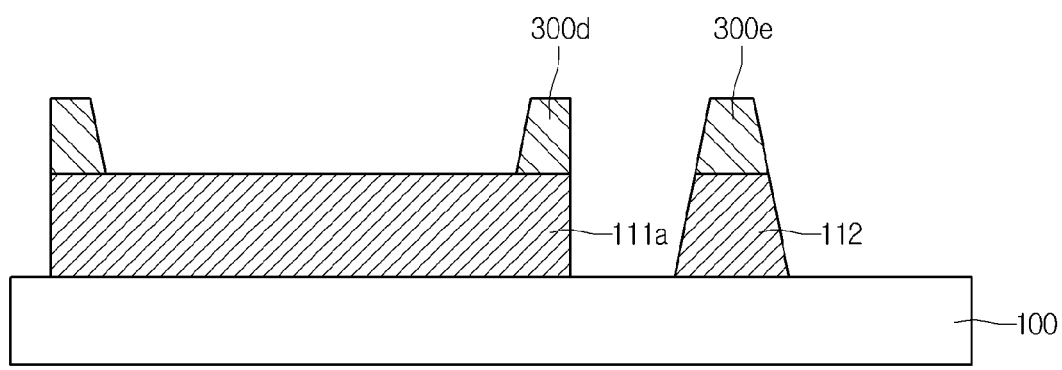

Subsequently, the exposed portions of the gate metal layer 101 are etched using the first and second photo resist patterns 300b and 300c as an etch mask, thereby patterning the gate metal layer 101 as shown in FIG. 4C. The patterning process allows a first gate metal layer pattern 111a on a gate electrode region and a second gate metal layer pattern 112 on a gate line region to remain. Thereafter, an ashing process is performed for the first and second photo resist patterns 300b and 300c, thereby removing the thin concave portion of the first photo resist pattern 300b. In accordance therewith, a part (i.e., a central portion) of the first gate metal layer pattern 111a is exposed and a third photo resist pattern 300d remains on the rest (i.e., the edge portion) of the first gate metal layer pattern 111a. Also, a fourth photo resist pattern 300e remains on the second gate metal layer pattern 112. The formation region of the third photo resist pattern 300d can correspond to the edge region of a gate electrode.

Figure 4D:
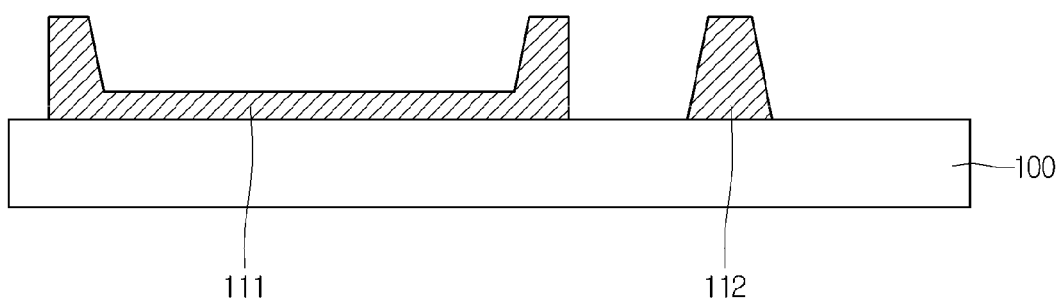

As shown in FIG. 4D, the exposed portion of the first gate metal layer 111a is etched by a desired thickness using the third and fourth photo resist patterns 300d and 300e as an etching mask, before removing the third and fourth photo resist patterns 300d and 300e. In accordance therewith, a gate line 112 and a gate electrode 111 is completed. The gate electrode 111 is formed to have a concaved structure (or stepped portions on its two ends). In other words, the edge region of the gate electrode 111 is thickly formed. The edge region surrounds an interior region (i.e., the central portion) of the gate electrode 111. The interior region of the gate electrode 111 is thinly formed such that the edge region is thicker than the interior region. Such a gate electrode 111 can be used as a first light blocking film pattern which shields or reflects light irradiated from a backlight unit (not shown). To this end, the gate electrode 111 is formed to have a wider area than not only a total area of source and drain electrode and a semiconductor layer of a thin film transistor, which are formed in later processes, but also the area of a second light blocking film pattern which is formed in a later process. Additionally, the gate electrode 111 used as a first light blocking film pattern and the gate line 112 can be formed through a single masking procedure which uses the half-tone mask.

Figure 4E:
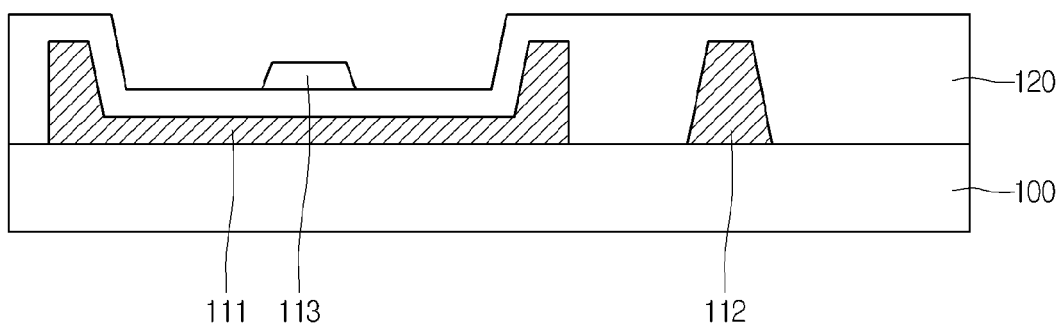

Referring to FIG. 4E, a gate insulation film 120 is formed on the entire surface of the substrate 100 provided with the gate electrode 111 and the gate line 112. The gate insulation film 120 can be formed from any one material selected from an inorganic insulation material group which includes silicon oxide $SiO_2$ and silicon nitride $SiN_x$.

A semiconductor layer 113 is formed on the gate insulation film 120 over the gate electrode 111 using a first masking procedure. For the formation of the semiconductor layer 113, an intrinsic amorphous silicon layer (a-Si:H) and an impurity-doped amorphous silicon layer (n+ or p+) are sequentially stacked on the gate insulation film 120 using a chemical vapor deposition (CVD) method. Thereafter, a photo resist is formed on the impurity-doped amorphous silicon layer (n+ or p+) and patterned into a photo resist pattern through exposure and development processes which use a first mask including a light blocking portion and a transparent portion. The intrinsic amorphous silicon layer (a-Si:H) and the impurity-doped amorphous silicon layer (n+ or p+) are sequentially etched using the photo resist pattern as an etch mask, before removing the photo resist pattern. In accordance therewith, the semiconductor layer 113 including an active layer and an ohmic contact layer can be formed.

Figure 4F:
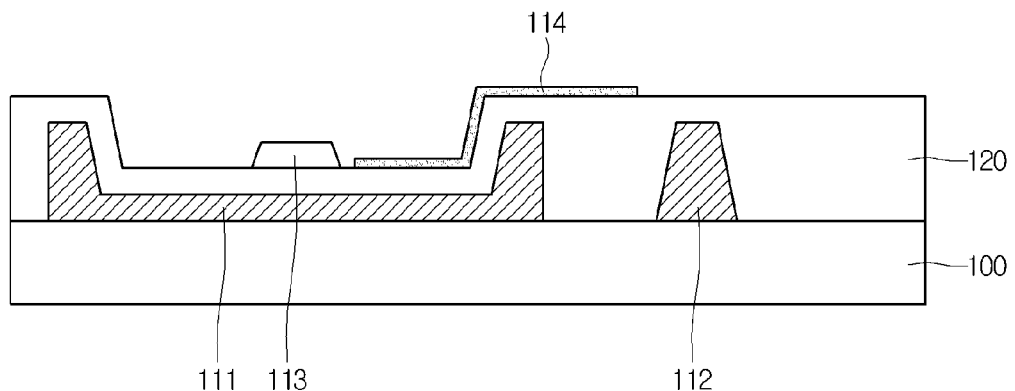

As shown in FIG. 4F, a pixel electrode 114 separated from the semiconductor layer 113 is formed on the gate insulation film 120 using a second masking procedure. The pixel electrode 114 can be formed by depositing a first transparent conductive layer on the gate insulation film 120 provided with the semiconductor layer 113 using a sputtering method, forming a photo resist on the first transparent conductive layer, patterning the photo resist into a photo resist pattern through exposure and development processes which use a second mask including light blocking portion and a transparent portion, etching the first transparent conductive layer using the photo resist pattern as an etching mask, and removing the photo resist pattern. The first transparent conductive layer can be formed from any one material selected from a material group which includes indium-tin-oxide ITO and indium-zinc-oxide IZO. The pixel electrode 114 is formed on the entire surface of a pixel region defined by the intersection of the gate line 112 and a data line 117 which will be formed in a later process. Also, the pixel electrode 114 is formed in such a manner as to be separated from the gate line 112 and the data line 117.

Figure 4G:
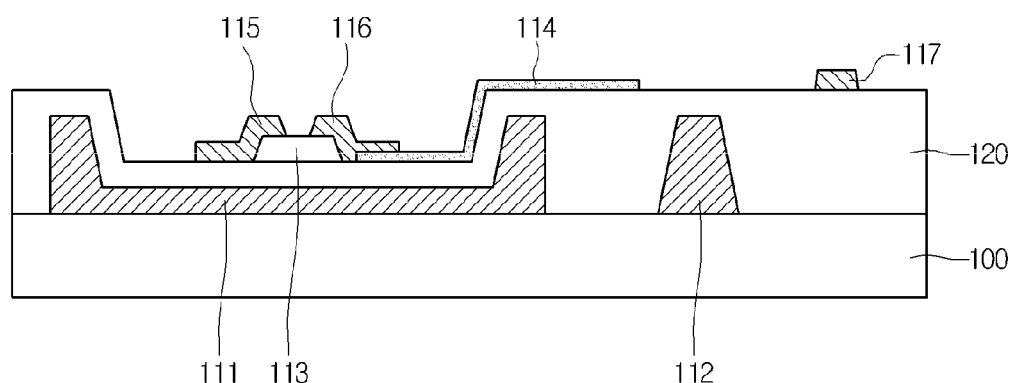

Referring to FIG. 4G, the data line 117, a source electrode 115 branched from the data line 117, and a drain electrode 116 separated from the source electrode 115 by the length of a channel region are formed on the gate insulation film 120, which is provided with the semiconductor layer 113 and the pixel electrode 114, using a third masking procedure. The data line 117, the source electrode 115 and the drain electrode 116 can be formed by depositing a conductive layer on the entire surface of the substrate 100 provided with the semiconductor layer 113 and the pixel electrode 114 using a sputtering method, forming a photo resist on the conductive layer, patterning the photo resist into photo resist patterns through exposure and development processes which use a third mask including a light blocking portion and transparent portions, etching the conductive layer using the photo resist patterns, and removing the photo resist patterns. The conductive layer can be formed from an opaque metal material. For example, the conductive layer can be formed from at least one material selected from a metal group which includes aluminum Al, tungsten W, copper Cu, molybdenum Mo, chromium Cr, titanium Ti, a molybdenum-tungsten alloy MoW, a molybdenum-titanium alloy MoTi, and a copper/molybdenum-titanium alloy Cu/MoTi.

After the conductive layer is etched, the ohmic contact layer formed in the channel region of the semiconductor layer 113 is etched and divided into two portions. The drain electrode 116 is directly connected to the pixel electrode 114.

In accordance therewith, a thin film transistor is formed at an intersection of the gate line 112 and the data line 117. The thin film transistor includes the gate electrode 111, the gate insulation film 120, the semiconductor layer 113, the source electrode 115 and the drain electrode 116. The source electrode 115 and the drain electrode 116 define a channel region in the semiconductor layer 113. Particularly, the semiconductor layer 113 and its channel region, the source electrode 115 and the drain electrode 116 are disposed over the thin interior region (or the depressed portion or the inside portion) of the gate electrode 111. In other words, the semiconductor layer 113, the source electrode 115 and the drain electrode 116 are disposed to overlap the thin interior region (or the depressed portion or the inside portion) of the gate electrode 111.

Additionally, the channel region of the semiconductor layer 113, the source electrode 115 and the drain electrode 116 are located within the concave indentation of the gate electrode 111. In other words, the top surface of the edge region of the gate electrode 111 (i.e. the surface that faces away from the substrate 100) can be higher than the top surface of the channel region of the semiconductor layer 113, top surface of the source electrode 115, and top surface of the drain electrode 116. This allows the edge region of the gate electrode 111 to prevent light from affecting the operation of the thin film transistor.

Figure 4H:
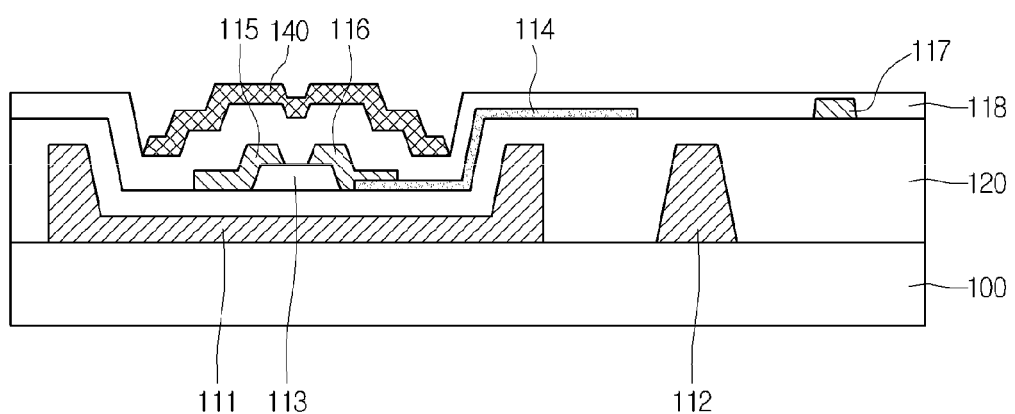

Referring to FIG. 4H, a passivation film 118 is formed by depositing any one of an inorganic insulation material and an organic insulation material on the entire surface of the substrate 100 which is provided with the source and data electrodes 115 and 116 and the data line 117.

Afterward, the second light blocking film pattern 140 is formed on the passivation film 118 over the source and drain electrodes 115 and 116 and the semiconductor layer 113 of the thin film transistor, using a fourth masking procedure. Also, the second light blocking film pattern 140 is disposed to overlap the gate electrode 111 of the thin film transistor. Such a second light blocking film pattern 140 can be formed by depositing a conductive layer on the passivation film 118 using a sputtering method, forming a photo resist on the conductive layer, patterning the photo resist into a photo resist pattern through exposure and development processes which use a fourth mask with an light blocking portion and a transparent portion, etching the conductive layer using the photo resist pattern as an etching mask, and removing the photo resist pattern. The conductive layer can be formed from an opaque metal material. For example, the conductive layer can be formed from at least one material selected from a metal group which includes aluminum Al, tungsten W, copper Cu, molybdenum Mo, chromium Cr, titanium Ti, a molybdenum-tungsten alloy MoW, a molybdenum-titanium alloy MoTi, and a copper/molybdenum-titanium alloy Cu/MoTi.

The above-mentioned second light blocking film pattern 140 is formed to have a wider area than a total area of the source and drain electrodes 115 and 116 and the semiconductor layer 113 but a narrower area than that of the gate electrode 111. Also, the second light blocking film pattern 140 formed on the upper side of the thin film transistor can prevent the inflow of reflected or scattered light into the thin film transistor.

Figure 4I:
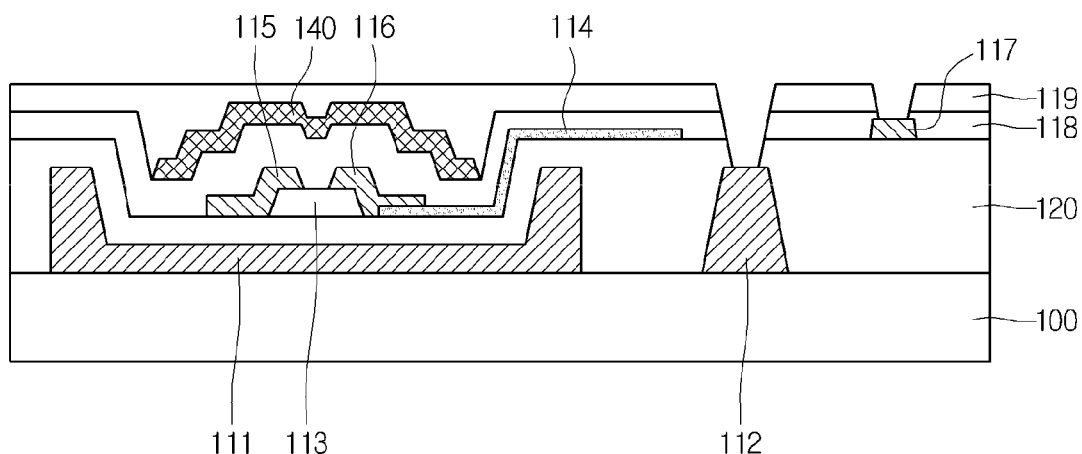

As shown in FIG. 4I, an interlayer insulation film 119 is formed on the entire surface of the substrate 100 provided with the second light blocking film pattern 140. The interlayer insulation film 119 can be formed by depositing one of an inorganic insulation material and an organic insulation material.

Subsequently, contact holes exposing the gate line within the formation region of a gate pad and the data line 117 within the formation region of a data pad are formed through a fifth masking procedure. The gate pad and the data pad are formed in the non-display area of the substrate 100. The contact holes exposing the gate line 112 and the data line 117 can be formed at the formation regions of the gate and data pads by forming a photo resist on the interlayer insulation film 119, patterning the photo resist into a photo resist pattern through exposure and development processes which use a fifth mask defined into an intercept portion and a transparent portion, etching the interlayer insulation film 119, the passivation film 118 and the gate insulation film 120 using the photo resist pattern as an etching mask, and removing the photo resist pattern.

Figure 4J:
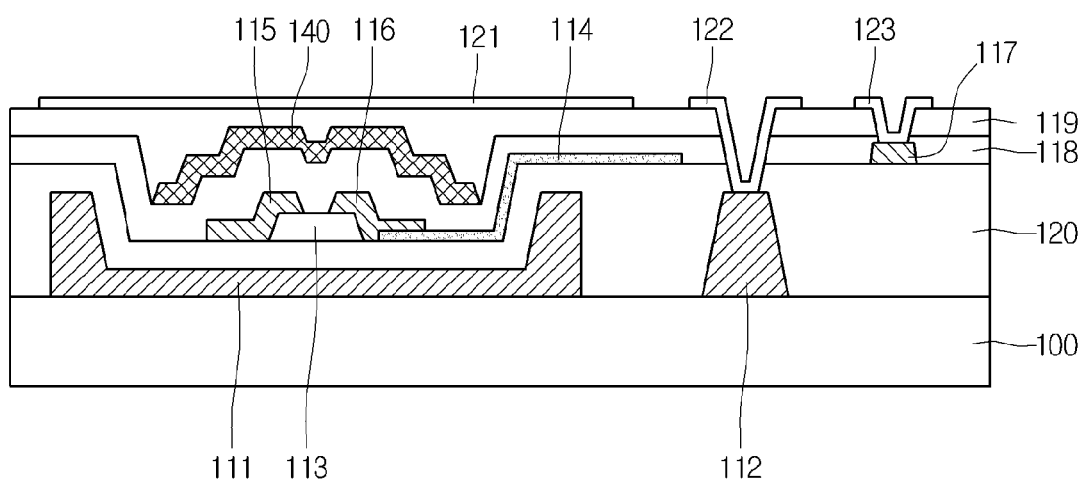

Referring to FIG. 4J, a common electrode 121, a gate pad electrode 122 and a data pad electrode 123 are formed on the interlayer insulation film 119 provided with the contact holes using a sixth masking procedure. The common electrode 121, the gate pad electrode 122 and the data pad electrode 123 can be formed by depositing a second transparent conductive layer on the interlayer insulation film 119 provided with the contact holes using a sputtering method, forming a photo resist on the second transparent conductive layer, patterning the photo resist into photo resist patterns through exposure and development processes which use a sixth mask defined into a light blocking portion and transparent portions, etching the second transparent conductive layer using the photo resist patterns as an etching mask, and removing the photo resist patterns. The common electrode 121 is disposed to overlap the pixel electrode 114 and formed to include a plurality of branches. The gate pad electrode 122 is in direct contact with the gate line 112 exposed in the gate pad formation region. The data pad electrode 123 is in direct contact with the data line 117 exposed in the data pad formation region. The second transparent conductive layer can be formed from any one material selected from a material group which includes indium-tin-oxide ITO and indium-zinc-oxide IZO.

The common electrode 121 is disposed to overlap the pixel electrode 114 with the interlayer insulation film 119 and the passivation film 118 therebetween. The common electrode 121 supplies each pixel with a common voltage which is used as a reference voltage necessary to drive a liquid crystal material. Also, the common electrode 121 together with the pixel electrode 114 forms a fringe field.

Although it is not shown in the drawings, an alignment film is formed on the substrate 100 provided with the common electrode 121.

The above-mentioned array substrate (i.e., the insulation substrate 100), also called a thin film transistor substrate, is combined with a color filter substrate which is not shown in the drawings. The color filter substrate includes a black matrix (not shown) formed to prevent the transmission of light through the rest of the color filter substrate except the pixel regions.

Also, red, green and blue color filter layers are formed on the respective pixel regions of the color filter substrate even though they are not shown in the drawings. The black matrix formed the color filter substrate is disposed between the red, green and blue color filter layers.

When the color filter substrate is combined with the insulation substrate corresponding to the thin film transistor substrate, the black matrix is disposed to overlap the rest of the insulation substrate 100 except the pixel regions. In other words, the black matrix is disposed to overlap the thin film transistor, the gate line and the data line.

Also, an upper alignment film is formed on the color filter layers even though it is not shown in the drawings. The upper alignment film enables liquid crystal molecules to be aligned in a desired direction.

If a data signal is applied to the pixel electrode 114 through the thin film transistor and the common voltage is applied to the common electrode 121, a fringe field is formed between the pixel electrode 114 and the common electrode 121. As such, the liquid crystal molecules between the insulation substrate 100 and the color filter substrate are rotated due to their dielectric anisotropy. Also, light transmittance of the pixel region varies along the rotated angle of the liquid crystal molecules. In accordance therewith, a variety of gray scale levels can be realized.

As described above, the array substrate of the LCD device according to the present disclosure uses the gate electrode as a first light blocking film pattern. This is unlike the second related art LCD, which includes a first light blocking film pattern that is formed on the opened insulation film and is separated from the gate electrode. Also, the fabricating method of the array substrate according to the present disclosure forms a gate electrode with a concaved inside region using a half-tone mask without forming a separate first light blocking film pattern. As such, the fabricating method according to the present disclosure requires only six normal masking procedures and a single half-tone masking procedure, unlike that of the second related art requiring a total of nine masking procedures. In accordance therewith, the array substrate of the present disclosure and the fabricating method thereof can reduce the number of processes and reduce fabrication costs.

Also, the array substrate of the present disclosure allows the light blocking members (i.e., the gate electrode 111 and the second light blocking film pattern 140) to be disposed in the upper sides and lower sides of the thin film transistor. As such, the inflow of light into the channel of the thin film transistor can be prevented. Therefore, the generation of leakage current in the thin film transistor within the LCD device can be prevented.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. An array substrate of a liquid crystal display device comprising:
    a thin film transistor that includes:
        a gate electrode having an edge region surrounding an interior region of the gate electrode, wherein the edge region of the gate electrode is thicker than the interior region of the gate electrode;
        a source electrode;
        a drain electrode; and
        a semiconductor layer having a channel region defined by the source electrode and the drain electrode, wherein the channel region is located over the interior region of the gate electrode.

2. The array substrate of claim 1, wherein the gate electrode is comprised of an opaque metal material that blocks light.

3. The array substrate of claim 1, further comprising:
    a light blocking film pattern formed over the channel region.

4. The array substrate of claim 3, wherein the light blocking film pattern is comprised of an opaque metal material that blocks light.

5. The array substrate of claim 3, wherein the gate electrode and the light blocking film pattern are comprised of a same material.

6. The array substrate of claim 3, wherein the gate electrode has a wider area than the light blocking film pattern.

7. The array substrate of claim 1, wherein the drain electrode and source electrode are located over the interior region of the gate electrode.

8. The array substrate of claim 1, wherein the gate electrode has a wider area than a total area occupied by the source electrode, the drain electrode, and the semiconductor layer.

9. The array substrate of claim 1, further comprising:
    a pixel electrode connected to the drain electrode; and
    a common electrode that overlaps with the pixel electrode.

10. The array substrate of claim 1, wherein a top surface of the edge region of the gate electrode is positioned higher than a top surface of the channel region.

* * * * *